US011802330B1

(12) United States Patent
Larose et al.

(10) Patent No.: US 11,802,330 B1
(45) Date of Patent: Oct. 31, 2023

(54) GAS TURBINE ENGINE COMPONENT WITH COPPER OXIDE COATING

(71) Applicant: Pratt & Whitney Canada Corp., Longueuil (CA)

(72) Inventors: Joël Larose, Longueuil (CA); Amit Roy, Montreal (CA); Navid Sharifi, Verdun (CA); Pantcho Stoyanov, Peaconsfield (CA); Christian Moreau, Boucherville (CA); Richard Chromik, Montreal (CA); Mary Makowiec, Manchester, CT (US)

(73) Assignees: The Royal Institution for the Advancement of Learning/McGill Concordia University, Montreal (CA); Concordia University, Montreal (CA); Pratt & Whitney Canada Corp., Longueuil (CA)

( * ) Notice: Subject to any disclaimer, the term of this patent is extended or adjusted under 35 U.S.C. 154(b) by 0 days.

(21) Appl. No.: 17/892,757

(22) Filed: Aug. 22, 2022

(51) Int. Cl.
| C23C 4/134 | (2016.01) |
| C23C 4/06 | (2016.01) |
| C23C 14/08 | (2006.01) |
| F01D 11/12 | (2006.01) |

(52) U.S. Cl.
CPC .......... C23C 4/134 (2016.01); C23C 4/06 (2013.01); C23C 14/087 (2013.01); F01D 11/122 (2013.01); F05D 2230/90 (2013.01); F05D 2300/30 (2013.01); F05D 2300/611 (2013.01)

(58) Field of Classification Search
CPC ......... C23C 4/134; C23C 4/06; F01D 11/122; F05D 2230/90; F05D 2300/30; F05D 2300/611

USPC ....................................................... 416/241 R
See application file for complete search history.

(56) References Cited

U.S. PATENT DOCUMENTS

| 5,081,858 | A | 1/1992 | Ito | |
| 7,713,635 | B2 | 5/2010 | Goto | |
| 2008/0280189 | A1* | 11/2008 | Kesler | H01M 4/9025 |
| | | | | 429/479 |
| 2013/0045334 | A1* | 2/2013 | Seals | C23C 4/134 |
| | | | | 427/372.2 |
| 2016/0047254 | A1* | 2/2016 | Bruck | C23C 28/324 |
| | | | | 428/307.3 |
| 2016/0298049 | A1* | 10/2016 | Vargas | C23C 4/06 |

FOREIGN PATENT DOCUMENTS

| EP | 0425073 B1 * | 1/1995 | |
| EP | 1167559 B1 * | 3/2006 | ........... B22F 1/0007 |
| JP | H06179053 A * | 6/1994 | |
| JP | 2017122253 A * | 7/2017 | |

OTHER PUBLICATIONS

Translation of JP-H06179053-A, Jun. 2023 (Year: 2023).*
Translation of JP-2017122253-A, Jun. 2023 (Year: 2023).*
Xu, Zhibiao, et al. "Tribological behaviors and microstructure evolution of Inconel 718 superalloy at mid-high temperature." Journal of Materials Research and Technology 14 (2021): 2174-2184.

* cited by examiner

Primary Examiner — J. Todd Newton
(74) Attorney, Agent, or Firm — Getz Balich LLC

(57) ABSTRACT

A formation method is provided. During this formation method, a metallic substrate is provided. A coating is deposited onto the metallic substrate using a suspension plasma spray process. The coating is formed from or otherwise includes copper oxide.

16 Claims, 5 Drawing Sheets

GAS TURBINE ENGINE COMPONENT WITH COPPER OXIDE COATING

TECHNICAL FIELD

This disclosure relates generally to a coating method and, more particularly, to depositing a metal oxide coating onto a metallic substrate.

BACKGROUND INFORMATION

A gas turbine engine component such as a rotor blade may include a dry lubricant. Some known dry lubricant coatings include graphite or molybdenum disulfide ($MoS_2$). While these known dry lubricant coatings have various benefits, there is still room in the art for improvement. There is a need in the art, in particular, for a dry lubricant coating that can accommodate continuously increasing internal temperatures within a gas turbine engine.

SUMMARY

According to an aspect of the present disclosure, a formation method is provided. During this formation method, a metallic substrate is provided. A coating is deposited onto the metallic substrate using a suspension plasma spray process. The coating is formed from or otherwise includes copper oxide.

According to another aspect of the present disclosure, another formation method is provided. During this formation method, a metallic substrate is provided. A plurality of particles are impinged against the metallic substrate to deposit a coating onto the metallic substrate. A first of the particles has a diameter less than ten microns. The coating is formed from or otherwise includes copper oxide.

According to still another aspect of the present disclosure, an apparatus is provided for a gas turbine engine. This apparatus includes a gas turbine engine component, and the gas turbine engine component includes a substrate and a coating on the substrate. The substrate is configured from or otherwise includes a nickel-based superalloy. The coating includes: a copper matrix; one or more regions of cupric oxide within the copper matrix; and one or more regions of cuprous oxide within the copper matrix.

The coating may include: between twenty and thirty percent by weight of the copper matrix; between ten and twenty percent by weight of the cupric oxide; and between fifty-five and sixty-five percent by weight of the cuprous oxide.

The diameter may be less than one micron.

The particles may be directed to impinge against the metallic substrate using a suspension plasma spray process.

The suspension plasma spray process may include: generating a plasma jet; introducing a liquid suspension into the plasma jet, where the liquid suspension includes a liquid and a plurality of copper oxide particles within the liquid; and propelling the copper oxide particles towards the metallic substrate with the plasma jet.

The depositing of the coating may include directing a plurality of copper oxide particles to the metallic substrate. A first of the copper oxide particles may have a diameter less than ten microns.

The depositing of the coating may include directing a plurality of copper oxide particles to the metallic substrate. A first of the copper oxide particles may have a diameter less than one micron.

The depositing of the coating may include directing a plurality of copper oxide particles to the metallic substrate. A first of the copper oxide particles may have a diameter between one-hundred nanometers and one-thousand nanometers.

The depositing of the coating may include impinging a plurality of cupric oxide particles against the metallic substrate.

The coating may be deposited directly onto the metallic substrate.

The coating that is deposited onto the metallic substrate may include one or more regions of cupric oxide.

The coating that is deposited onto the metallic substrate may include more regions of cuprous oxide.

The coating that is deposited onto the metallic substrate may include one or more regions consisting essentially of/only including copper.

The coating that is deposited onto the metallic substrate may include: a copper matrix; one or more regions of cupric oxide within the copper matrix; and one or more regions of cuprous oxide within the copper matrix.

The coating that is deposited onto the metallic substrate may include: between twenty and thirty percent by weight copper; between ten and twenty percent by weight cupric oxide; and between fifty-five and sixty-five percent by weight cuprous oxide.

The metallic substrate may be configured from or otherwise include nickel.

The metallic substrate may be configured from or otherwise include a superalloy.

The substrate may be part of a gas turbine engine component.

The present disclosure may include any one or more of the individual features disclosed above and/or below alone or in any combination thereof.

The foregoing features and the operation of the invention will become more apparent in light of the following description and the accompanying drawings.

DETAILED DESCRIPTION

Figure 1:
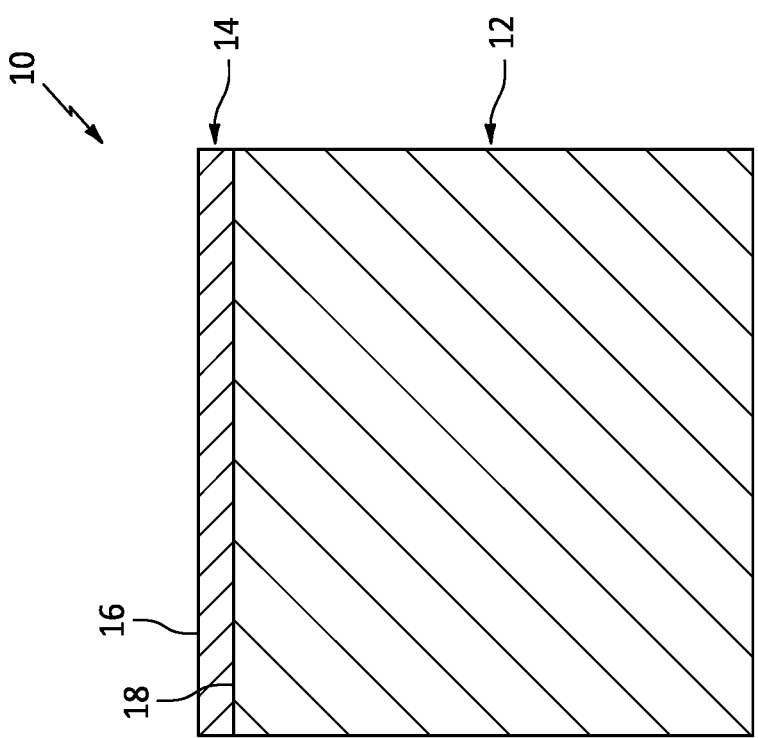
FIG. 1 is a sectional illustration of a portion of a coated body.

FIG. 1 illustrates a portion of a coated body 10. This coated body 10 includes a metallic substrate 12 and a copper oxide coating 14.

The metallic substrate 12 is formed from metal. This metal may be selected to operate within a relatively high temperature environment such as an environment within a hot section of a gas turbine engine; e.g., a combustor section, a turbine section, an exhaust section, etc. The metal, in particular, may be a nickel-based alloy and/or a metal superalloy. For example, the metal may be a nickel-based superalloy such as such as, but not limited to, Inconel 718. The nickel-based superalloy may include:
- no more than 0.08 percent by weight carbon (C);
- no more than 0.35 percent by weight manganese (Mn);
- no more than 0.015 percent by weight phosphorus (P);
- no more than 0.015 percent by weight sulfur (S);
- no more than 0.35 percent by weight silicon (Si);
- between 17-21 percent by weight chromium (Cr);
- between 50-55 percent by weight nickel (Ni);
- between 2.80-3.30 percent by weight molybdenum (Mo);
- between 4.75-5.50 percent by weight columbium (Nb);
- between 0.65-1.15 percent by weight titanium (Ti);
- between 0.20-0.80 percent by weight aluminum (Al);
- no more than 1.00 percent by weight cobalt (Co);
- no more than 0.006 percent by weight boron (B);
- no more than 0.30 percent by weight copper (Cu);
- no more than 0.0005 percent by weight lead (Pb);
- no more than 0.0005 percent by weight bismuth (Bi);
- no more than 0.0005 percent by weight selenium (Se); and
- balance iron (Fe).

The present disclosure, however, is not limited to such an exemplary nickel-based superalloy composition. Furthermore, the present disclosure is not limited to nickel-based superalloys. The metal, for example, may alternatively be a cobalt-based superalloy, an iron-based superalloy or various other metal alloys or pure metals with relatively high temperature capabilities.

The copper oxide coating 14 may form an exterior surface 16 of the coated body 10. The copper oxide coating 14 is disposed on/over an exterior surface 18 of the metallic substrate 12; e.g., a surface formed by the metal. The copper oxide coating 14 of FIG. 1, for example, is disposed directly on, bonded to and/or contacts the substrate surface 18. The copper oxide coating 14, however, may alternatively be bonded indirectly to the metallic substrate 12 through an intermediate bond coat (and/or other intermediate layer or layers).

The copper oxide coating 14 is configured to provide the coated body 10 and its metallic substrate 12 with a solid lubricant and/or protective coating. The copper oxide coating 14, for example, may form an elevated temperature solid lubricant capable of operating at temperatures above, for example, three-hundred degrees Celsius (300°) (~572° Fahrenheit). By contrast, certain other solid lubricant materials such as graphite and/or molybdenum disulfide ($MoS_2$) may degrade (e.g., vaporize and/or oxidize) at such elevated temperatures.

Figure 2:
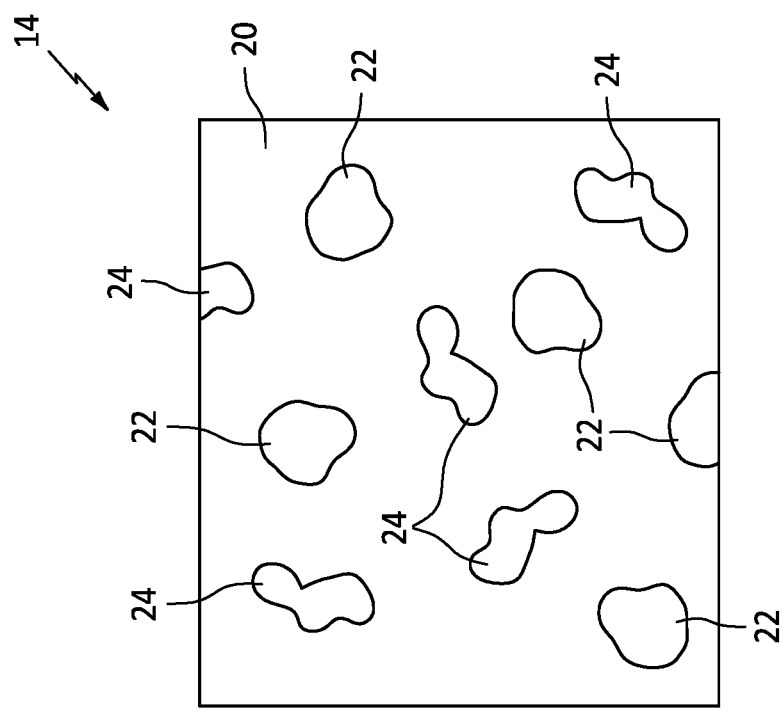
FIG. 2 is a schematic sectional illustration of a portion of a copper oxide coating.

The copper oxide coating 14 is formed from copper oxide material. This copper oxide material may include one or more different copper oxides such as, but not limited to, cupric oxide (CuO) and/or cuprous oxide ($Cu_2O$). The copper oxide material may also include some pure copper (Cu). For example, referring to FIG. 2, the copper oxide coating 14 and its copper oxide material may include a matrix 20 of copper and one or more regions 22 and 24 (e.g., volumes, pockets, etc.) of copper oxide within the copper matrix 20 (schematically shown in FIG. 2). The copper matrix 20 may be formed completely or substantially of the pure copper. The copper oxide regions may at least (or only) include one or more regions 22 of substantially (or only) the cupric oxide (CuO) and/or one or more regions 24 of substantially (or only) the cuprous oxide ($Cu_2O$). With such structure, new (e.g., previously unexposed) copper oxide regions 22 and/or 24 may continuously be provided (e.g., exposed) as the copper oxide coating 14 wears away. The copper oxide coating 14 may thereby maintain its lubricity and/or other coating properties while wearing. In some embodiments, the copper oxide coating 14 may include:
- between twenty percent (20%) and thirty percent (30%) by weight copper (Cu), such as about or exactly 24.6% by weight copper;
- between ten percent (10%) and twenty percent (20%) by weight cupric oxide (CuO), such as about or exactly 15.1% by weight cupric oxide; and
- between fifty-five percent (55%) and sixty-five percent (65%) by weight cuprous oxide ($Cu_2O$), such as about or exactly 60.3% by weight cuprous oxide.

The present disclosure, however, is not limited to such an exemplary copper oxide coating. Furthermore, the present disclosure is not limited to such exemplary copper oxide coating components nor to such an exemplary copper oxide coating structure.

Figure 3:
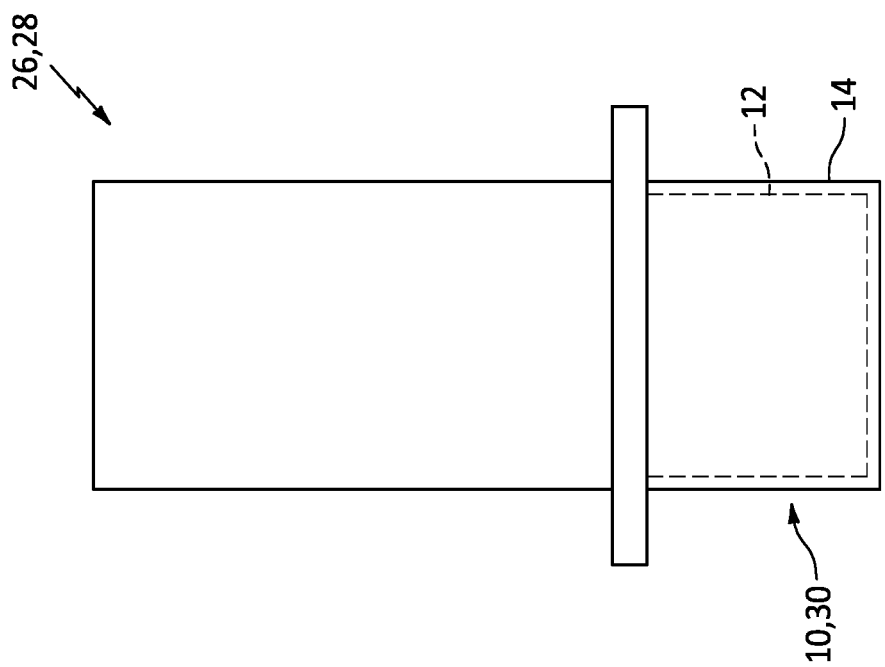
FIG. 3 is a schematic illustration of a rotor blade.

Referring to FIG. 3, the coated body 10 may be configured as, or may be part of, a component 26 of a gas turbine engine. The coated body 10 of FIG. 3, for example, is configured as a rotor blade 28; e.g., a turbine blade. The metallic substrate 12 may form an attachment 30 (e.g., a root, a neck, etc.) of the rotor blade 28. The copper oxide coating 14 may cover at least a portion of the attachment 30. The copper oxide coating 14 may thereby provide a buffer between the attachment 30 and a rotor disk (not shown in FIG. 3) to which the rotor blade 28 is mounted. The present disclosure, however, is not limited to rotor blade applications. The gas turbine engine component 26, for example, may alternatively be configured as a seal element such as, but not limited to, a feather seal, a blade outer air seal (BOAS), a shroud, etc. Of course, various other gas turbine engine components may also or alternatively benefit from use of the copper oxide coating 14. For example, the copper oxide coating 14 may be applied to a metallic substrate of any gas turbine engine component which engages (e.g., contacts) and may rub against another gas turbine engine component.

Figure 4:
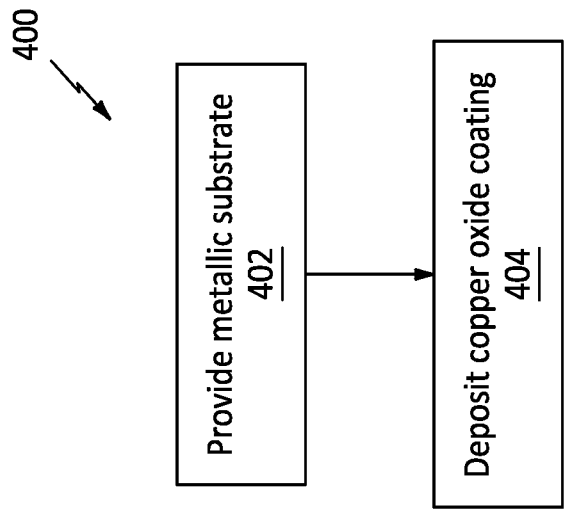
FIG. 4 is a flow diagram of a method for forming a coated body.

FIG. 4 is a flow diagram of a method 400 for forming a coated body. For ease of description, this formation method 400 is described herein with respect to the coated body 10. The formation method 400 of the present disclosure, however, is not limited to such an exemplary coated body or body structure and/or material components.

In step 402, the metallic substrate 12 is provided. This metallic substrate 12 may form a newly manufactured component. The metallic substrate 12, for example, may be cast, wrought and/or additively manufactured, and subsequently machined and/or otherwise modified for the formation method 400. Alternatively, the metallic substrate 12 may form a reconditioned component. The metallic substrate 12, for example, may be part of a component which was previously in service and conditioned (e.g., repaired, stripped, etc.) for the formation method 400.

Figure 5:
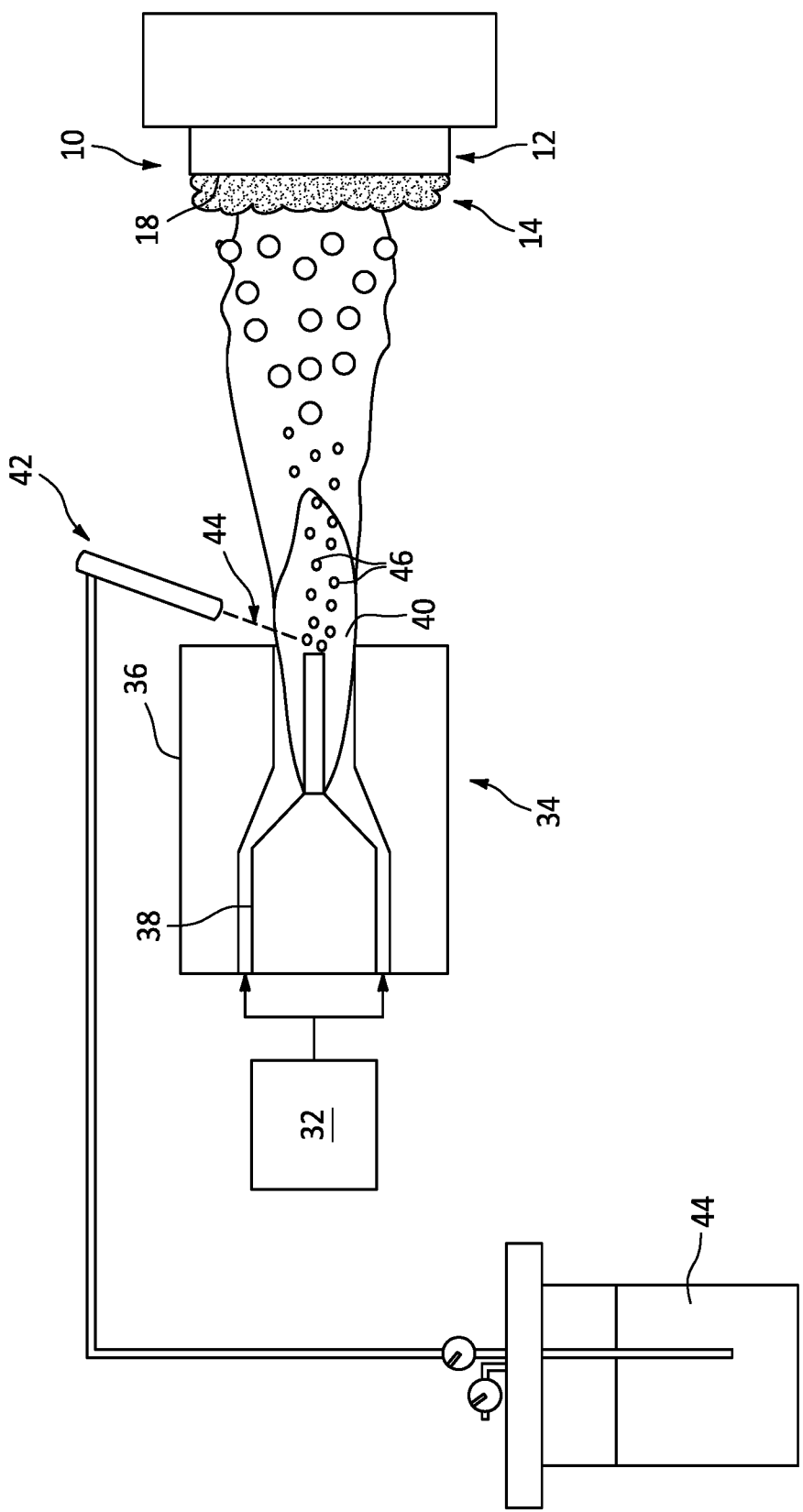
FIG. 5 is a schematic illustration of a system for depositing a copper oxide coating onto a metallic substrate.
Figure 6:
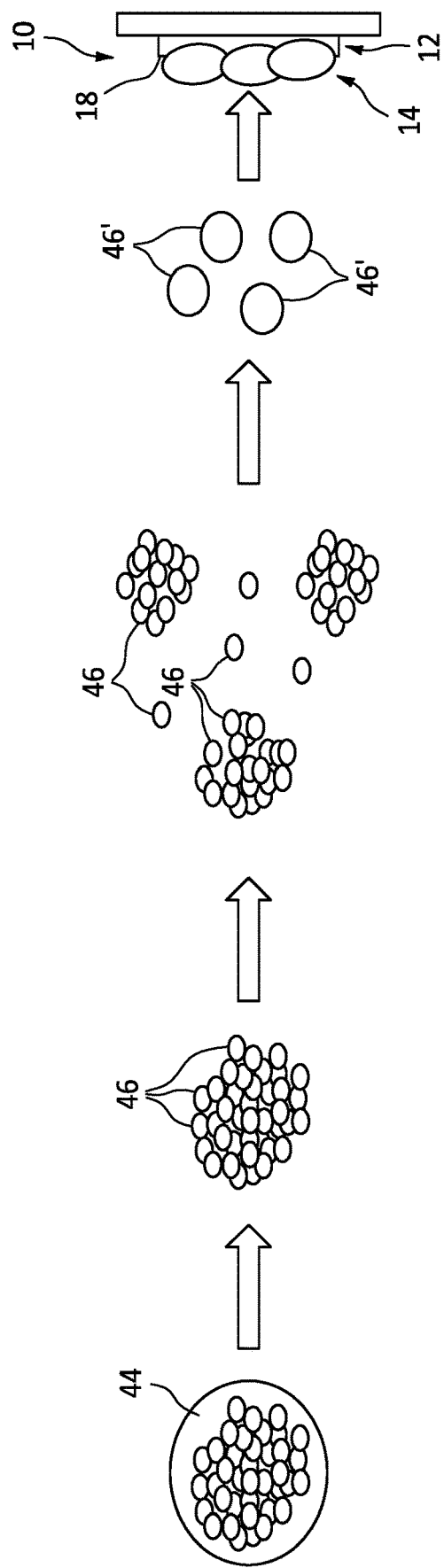
FIG. 6 is a schematic illustration of copper oxide particles interacting with and carried by a plasma jet.

In step 404, the copper oxide coating 14 is deposited onto the metallic substrate 12. The copper oxide coating 14, in particular, may be deposited onto the substrate surface 18 using a suspension plasma spray (SPS) (i.e., radial and axial injection) process. For example, referring to FIG. 5, a gas source 32 directs a stream of gas (e.g., argon (Ar) gas, helium (He) gas or hydrogen ($H_2$) gas) through an ignitor 34 including an anode 36 and a cathode 38. The anode 36 and the cathode 38 generate an electric arc that ignites the gas stream and provides a plasma jet 40; e.g., a focused stream of plasma. This plasma jet 40 is directed towards the metallic substrate 12 and a region of its surface 18 to be coated. A liquid suspension injector 42 introduces (e.g., directs) a liquid suspension 44 into the plasma jet 40, where a stream of the liquid suspension 44 being introduced into the plasma jet 40 may be angularly offset from (e.g., perpendicular or acutely angled to) or aligned (e.g., parallel) with the plasma jet 40. This liquid suspension 44 may include a plurality of copper oxide particles 46 suspended within a carrier liquid such as, but not limited to, water or alcohol (e.g., ethanol) or a mixture of water and alcohol. The plasma jet 40 evaporates the liquid and propels (e.g., carries) the copper oxide particles 46 towards/to the metallic substrate 12 and the region of its surface 18 to be coated. More particularly, referring to FIG. 6, the plasma jet 40 of FIG. 5 breaks up the liquid suspension 44 following introduction into the plasma jet 40. The liquid and dispersants are evaporated, and the copper oxide particles 46 aggregate, are heated into molten particles 46' and are accelerated towards the metallic substrate 12. The molten copper oxide particles 46' impinge against the substrate surface 18 and/or previously (e.g., just) applied copper oxide coating material to form the copper oxide coating 14. While the copper oxide particles 46 may suspended in the carrier liquid as described above, a fluidized bed particle suspension feeder may alternatively be used to avoid use of the carrier liquid.

The copper oxide particles 46 suspended within the liquid suspension 44 and/or carried by the plasma jet 40 may be or otherwise include cupric oxide (CuO) particles. At least some or all of the copper oxide particles 46 may each be sized with a dimension (e.g., a diameter) less than ten microns (10 μm) and greater than one-hundred nanometers (100 nm). The particle dimension, for example, may be less than four microns (4 μm), three microns (3 μm), two microns (2 μm), one micron (1 μm or 1000 nm) or five-hundred nanometers (500 nm). It has been found that other thermal spray processes such as an air plasma spray (APS) process, a high velocity oxygen fuel (HVOF) coating process, and a high velocity air fuel (HVAF) coating process may have difficultly (or cannot) deposit such ultrafine/nanosized particles. Furthermore, depositing the copper oxide coating 14 with ultrafine/nanosized copper oxide particles 46 may provide improved material properties. The present disclosure, however, is not limited to the foregoing exemplary copper oxide particle dimensions nor deposition process.

Figure 7:
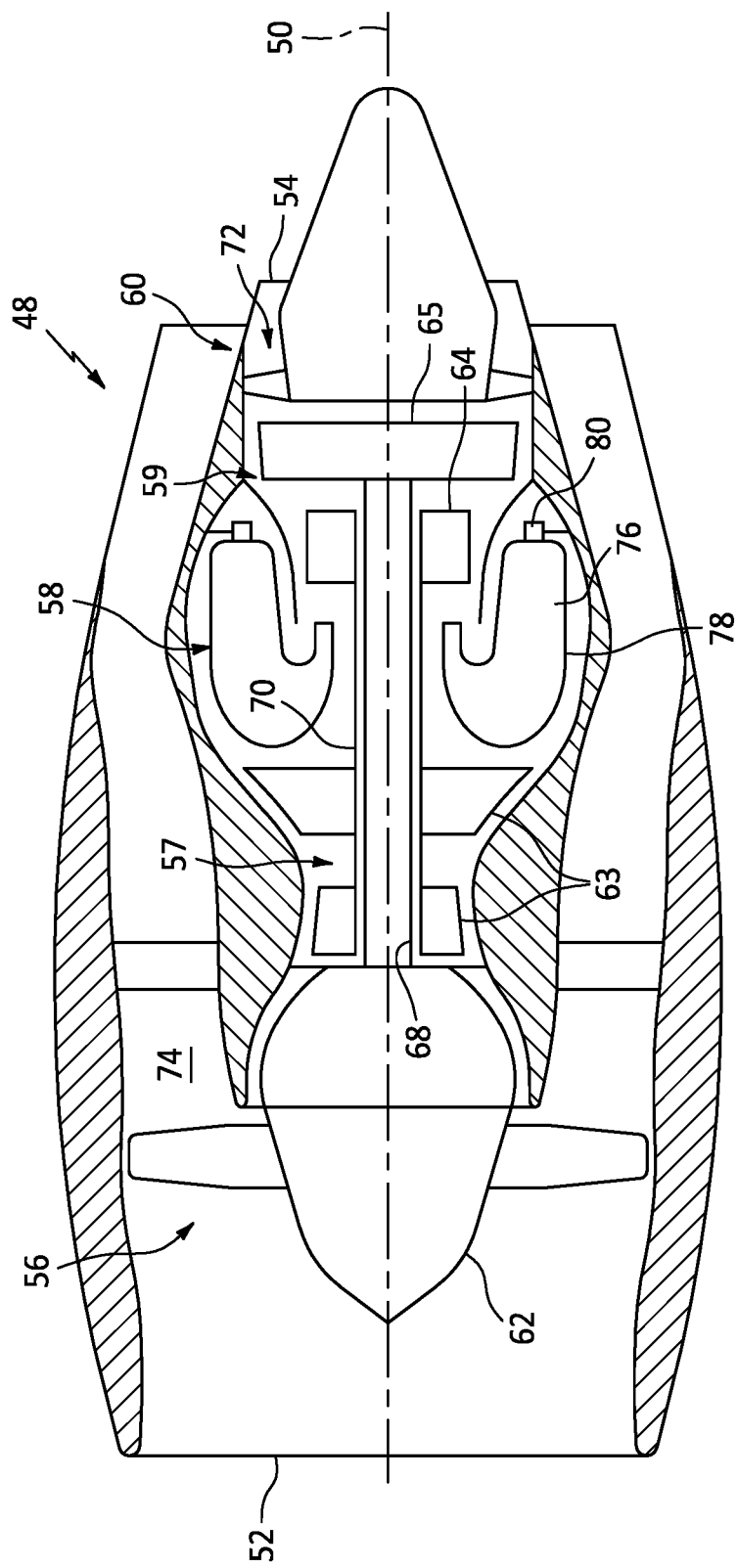
FIG. 7 is a schematic sectional illustration of a gas turbine engine with which the coated body may be included.

FIG. 7 illustrates an example of the gas turbine engine which may include the coated body 10 described above. This gas turbine engine of FIG. 7 is configured as a turbofan gas turbine engine 48. The gas turbine engine 48 of FIG. 7 extends along an axial centerline 50 of the gas turbine engine 48 between an upstream airflow inlet 52 and a downstream airflow exhaust 54. The gas turbine engine 48 includes a fan section 56, a compressor section 57, the combustor section 58, the turbine section 59 and the exhaust section 60. Any one of the engine sections 56-60, for example, may include the engine component 26 described above.

The fan section 56 includes a fan rotor 62. The compressor section 57 includes a compressor rotor 63. The turbine section 59 includes a high pressure turbine (HPT) rotor 64 and a low pressure turbine (LPT) rotor 65, where the LPT rotor 65 is configured as a power turbine rotor. Each of these rotors 62-65 includes a plurality of rotor blades arranged circumferentially around and connected to one or more respective rotor disks.

The fan rotor 62 is connected to the LPT rotor 65 through a low speed shaft 68. The compressor rotor 63 is connected to the HPT rotor 64 through a high speed shaft 70. The low speed shaft 68 extends through a bore of the high speed shaft 70 between the fan rotor 62 and the LPT rotor 65.

During operation, air enters the gas turbine engine 48 through the airflow inlet 52. This air is directed through the fan section 56 and into a core flowpath 72 and a bypass flowpath 74. The core flowpath 72 extends sequentially through the engine sections 57-60; e.g., a core of the gas turbine engine 48. The air within the core flowpath 72 may be referred to as "core air". The bypass flowpath 74 extends through a bypass duct, which bypasses the engine core. The air within the bypass flowpath 74 may be referred to as "bypass air".

The core air is compressed by the compressor rotor 63 and directed into a (e.g., annular) combustion chamber 76 of a (e.g., annular) combustor 78 in the combustor section 58. Fuel is injected into the combustion chamber 76 via one or more of the fuel injectors 80 and mixed with the compressed core air to provide a fuel-air mixture. This fuel-air mixture is ignited and combustion products thereof flow through and sequentially cause the HPT rotor 64 and the LPT rotor 65 to rotate. The rotation of the HPT rotor 64 drives rotation of the compressor rotor 63 and, thus, compression of air received from an inlet into the core flowpath 72. The rotation of the LPT rotor 65 drives rotation of the fan rotor 62, which propels bypass air through and out of the bypass flowpath 74. The propulsion of the bypass air may account for a significant portion (e.g., a majority) of thrust generated by the gas turbine engine 48.

The coated body 10 may be included in various gas turbine engines other than the one described above. The coated body 10, for example, may be included in a geared gas turbine engine where a gear train connects one or more shafts to one or more rotors in a fan section, a compressor section and/or any other engine section. Alternatively, the coated body 10 may be included in a gas turbine engine configured without a gear train. The coated body 10 may be included in a gas turbine engine configured with a single spool, with two spools (e.g., see FIG. 7), or with more than two spools. The gas turbine engine may be configured as a turbofan engine, a turbojet engine, a turboprop engine, a turboshaft engine, a propfan engine, a pusher fan engine or any other type of gas turbine engine. The gas turbine engine may alternatively be configured as an auxiliary power unit (APU) or an industrial gas turbine engine. The present disclosure therefore is not limited to any particular types or configurations of gas turbine engines.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:
1. A formation method, comprising:
providing a metallic substrate; and
depositing a coating onto the metallic substrate using a suspension plasma spray process, the coating comprising copper oxide;
the suspension plasma spray process comprising:
generating a plasma jet;
introducing a liquid suspension into the plasma jet, the liquid suspension comprising a liquid and a plurality of copper oxide particles within the liquid; and
propelling the plurality of copper oxide particles towards the metallic substrate with the plasma jet.

2. The formation method of claim 1, wherein the depositing of the coating comprises directing a plurality of copper oxide particles to the metallic substrate; and a first of the plurality of copper oxide particles has a diameter less than ten microns.

3. The formation method of claim 1, wherein the depositing of the coating comprises directing a plurality of copper oxide particles to the metallic substrate; and a first of the plurality of copper oxide particles has a diameter less than one micron.

4. The formation method of claim 1, wherein the depositing of the coating comprises directing a plurality of copper oxide particles to the metallic substrate; and a first of the plurality of copper oxide particles has a diameter between one-hundred nanometers and one-thousand nanometers.

5. The formation method of claim 1, wherein the depositing of the coating comprises impinging a plurality of cupric oxide particles against the metallic substrate.

6. The formation method of claim 1, wherein the coating is deposited directly onto the metallic substrate.

7. The formation method of claim 1, wherein the coating deposited onto the metallic substrate comprises one or more regions of cupric oxide.

8. The formation method of claim 1, wherein the coating deposited onto the metallic substrate comprises more regions of cuprous oxide.

9. The formation method of claim 1, wherein the coating deposited onto the metallic substrate comprises one or more regions consisting essentially of copper.

10. The formation method of claim 1, wherein the coating deposited onto the metallic substrate includes a copper matrix; one or more regions of cupric oxide within the copper matrix; and one or more regions of cuprous oxide within the copper matrix.

11. The formation method of claim 1, wherein the coating deposited onto the metallic substrate includes between twenty and thirty percent by weight copper; between ten and twenty percent by weight cupric oxide; and between fifty-five and sixty-five percent by weight cuprous oxide.

12. The formation method of claim 1, wherein the metallic substrate comprises nickel.

13. The formation method of claim 1, wherein the metallic substrate comprises a superalloy.

14. The formation method of claim 1, wherein the substrate is part of a gas turbine engine component.

15. A formation method, comprising:
providing a metallic substrate;
generating a plasma jet;
introducing a liquid suspension into the plasma jet, the liquid suspension comprising a liquid and a plurality of copper oxide particles within the liquid; and
impinging the plurality of copper oxide particles which are
propelled by the plasma jet against the metallic substrate to deposit a coating onto the metallic substrate, a first of the plurality of copper oxide particles having a diameter less than ten microns, and the coating comprising copper oxide.

16. The formation method of claim 15, wherein the diameter is less than one micron.

* * * * *